United States Patent [19]

Septfons et al.

[11] Patent Number: 4,991,666

[45] Date of Patent: Feb. 12, 1991

[54] TERMINAL PAD FOR FIXING A CLAWED PIN TO THE EDGE OF A HYBRID CIRCUIT SUBSTRATE AND A CONNECTION FORMED THEREBY

[75] Inventors: René Septfons, Paris; Michel Rabartin, Orsay, both of France

[73] Assignee: Societe Anonyme dite: Alcatel Cit, Paris, France

[21] Appl. No.: 288,189

[22] Filed: Dec. 22, 1988

[51] Int. Cl.$^5$ .............................................. H05K 1/00
[52] U.S. Cl. .................................. 174/261; 174/267; 361/406; 439/79; 439/81
[58] Field of Search ............... 174/685, 267; 361/406; 439/79, 81, 83

[56] References Cited

U.S. PATENT DOCUMENTS

| | | | |
|---|---|---|---|
| 3,381,081 | 4/1968 | Schalliol | 174/685 |
| 3,536,821 | 10/1970 | Doering, Jr. | 439/81 X |
| 3,689,684 | 9/1972 | Cox, Jr. et al. | 174/261 |
| 4,037,898 | 7/1977 | Guyette | 439/79 X |
| 4,091,529 | 5/1978 | Zaleckas | 174/68.5 X |
| 4,464,832 | 8/1984 | Asick et al. | 174/68.5 X |
| 4,502,745 | 3/1985 | Chavers et al. | 439/83 |
| 4,737,115 | 4/1988 | Seidler | 439/83 |

FOREIGN PATENT DOCUMENTS 2029652 3/1980 United Kingdom .

OTHER PUBLICATIONS

32nd Electronic Components Conference, May 10-12, 1982, San Diego, Calif., pp. 346-353, IEEE; H. N. Keller, "Significant Features of Solder Connections to Gold-Plated Thin Films".

Solid State Technology, vol. 25, No. 10, Oct. 1982, pp. 99-104, Port Washington, N.Y., E. A. Gutbier, et al., "More Reliable Connections to Condensation-Soldered Terminals".

Primary Examiner—Morris H. Nimmo
Attorney, Agent, or Firm—Sughrue, Mion, Zinn, Macpeak & Seas

[57] ABSTRACT

The edge terminal pad is intended to receive a connection pin (30). It has two tinnable area solder blobs (17, 18) placed overlying each other on opposite faces of a margin of a substrate (10) at locations which are grasped by the claws (33, 34, 35) of the pin (30), with said claws forming the jaws of a resilient clamp. The tinnable area solder blob (17, 18) are notched by grooves (19, 20) at the locations of slide paths followed by the claws (33, 34, 35) while the pin (30) is being put into place. For a pin (30) having three claws with the combined width of all three claws being the same as the width of a terminal pad, one of the pad's tinnable area solder blobs (17) is generally U-shaped, while the other (18) is generally T-shaped. The advantage of the grooves is to restrict the amounts by which the clamp of the pin needs to open and to automatically center the pin on the pad, providing the pin is put into place after the tinnable areas (17, 18) have already been tinned.

10 Claims, 3 Drawing Sheets

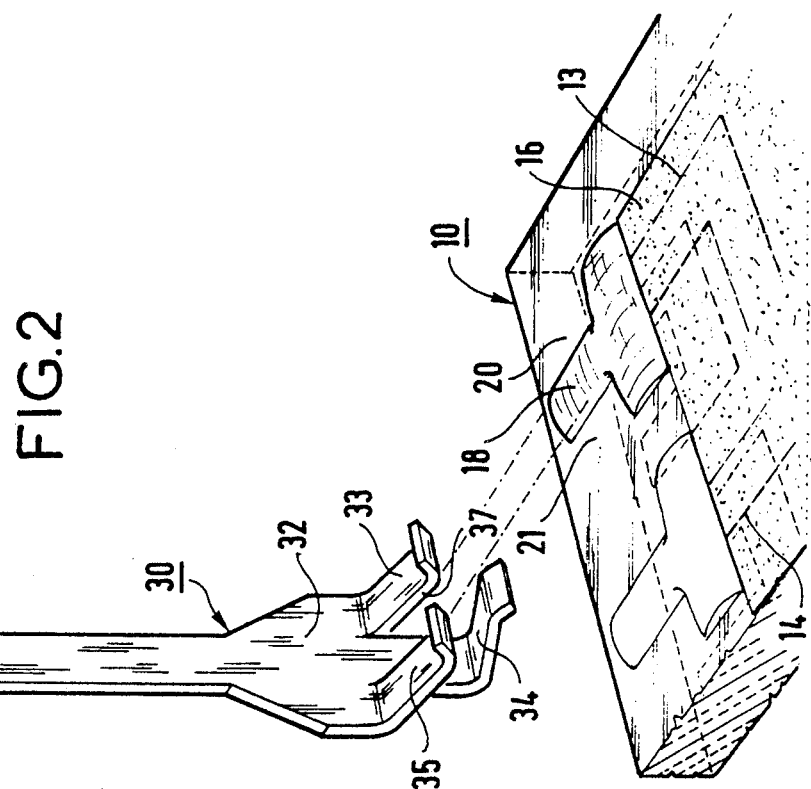
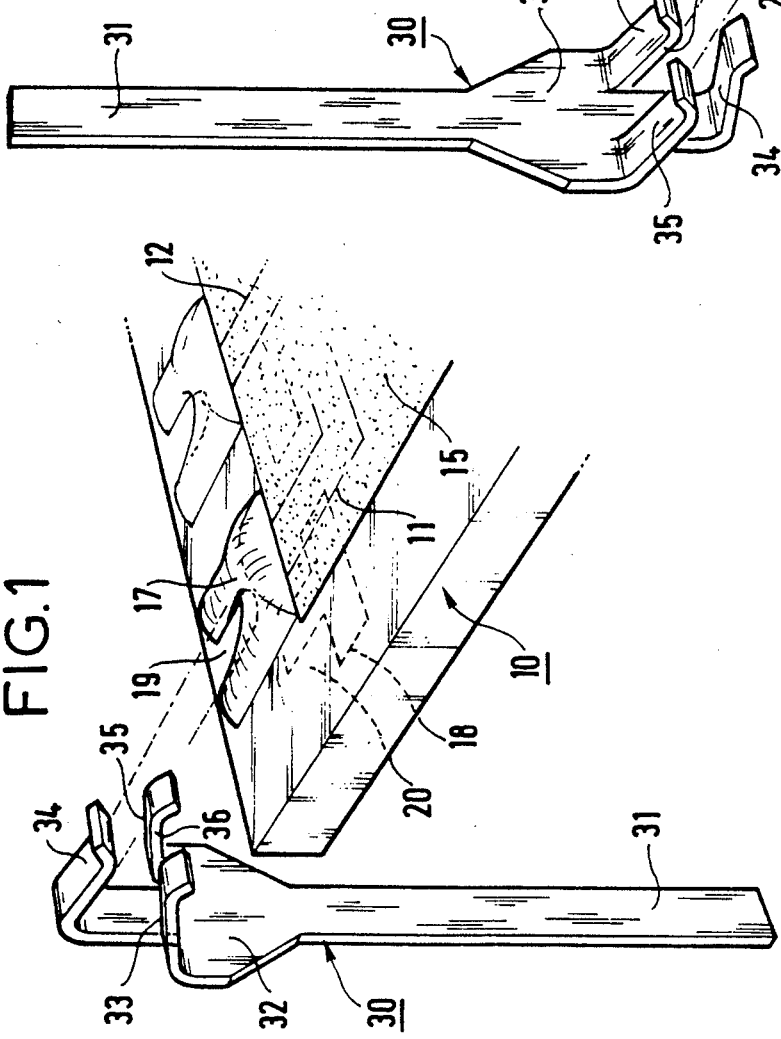

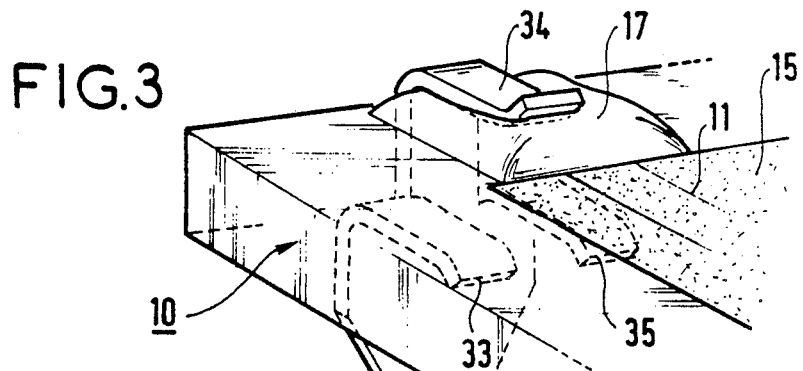
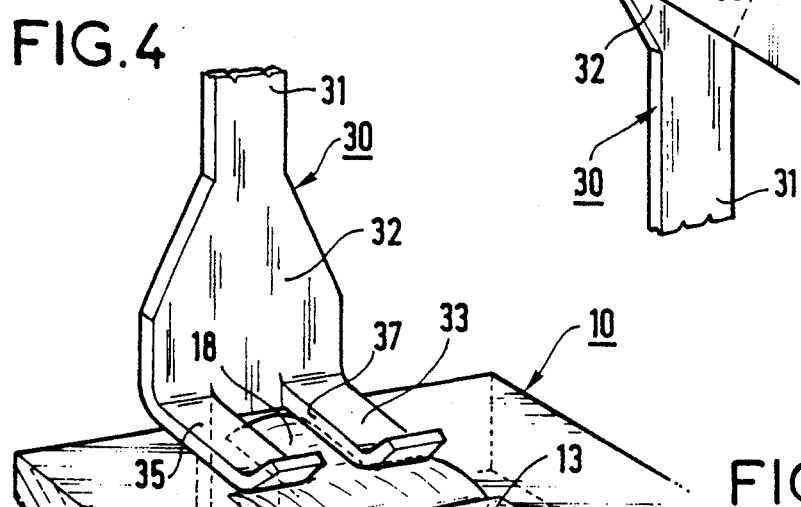
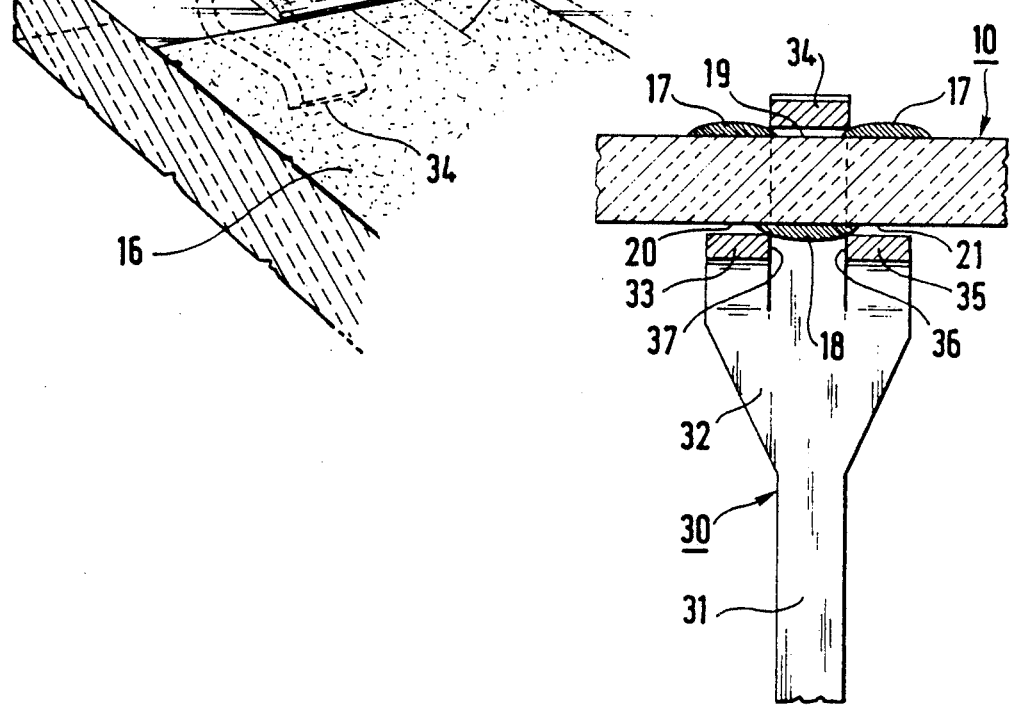

TERMINAL PAD FOR FIXING A CLAWED PIN TO THE EDGE OF A HYBRID CIRCUIT SUBSTRATE AND A CONNECTION FORMED THEREBY

The present invention relates to hybrid circuits, i.e. subassemblies of electronic components assembled at high density on a flat support called a substrate and generally constituted by a thin plate of ceramic covered on one or two faces with a screen-printed network of resistors and of conducting tracks which may optionally be protected by a vitrified insulating coating, together with pads suitable for being tinned for having electronic components fixed thereto by soldering. It relates more particularly to "terminal" pads, i.e. pads capable of being tinned and disposed along the edges of substrates for the purpose of fixing the pins used to provide electrical connections between hybrid circuits and the outside environment.

BACKGROUND OF THE INVENTION

In general, connection pins are made in strip form by stamping and folding electrically conducting metal sheet with each pin having a head terminated by a three-claw resilient clamp offset sideways and intended to fix onto the edge of a substrate, with two of the claws engaging one face of the substrate and with the third claw engaging the opposite face.

Terminal pads on the edge of a substrate for receiving said pins are generally constituted by two rectangular areas capable of being tinned and having the same width as the clamp on a pin, said areas being disposed to overlie each other on opposite faces at the edge of substrate at locations where the three claws of the clamp on a pin will grasp the substrate.

Strips of connection pins are mounted on the edges of a substrate while the substrate is still bare but after it has been tinned so that all of the components can be put into place thereon and then simultaneously reflow soldered. In other words, the pins are mounted on terminal pads which are coated with blobs of solder of thickness which is difficult to control and which is non-negligible in comparison with the thickness of the substrate. This gives rise to at least two drawbacks, with the first drawback being the difficulty of centering the three-claw clamp of a pin on a pad by virtue of the two blobs constituting a somewhat spherical shape, and the second drawback is that the blobs of solder on the pads are sometimes thicker than the elastic limit of the claws in a pin's clamp, thereby reducing the spring effect and preventing the claws of the clamp from returning to direct contact with the substrate during the reflow operation.

The object of the present invention is to combat these drawbacks which increase assembly time and which give rise to a high retouching rate.

SUMMARY OF THE INVENTION

The present invention provides a terminal pad for fixing a clawed pin to the edge of a hybrid circuit substrate, the pad including at least one tinnable area placed on a margin of the substrate in a position suitable for being grasped by the claws of the pin, which claws constitute the jaws of a resilient clamp for clamping to the edge of the substrate for fixing the pin thereto, wherein said tinnable area is notched with a groove for each of the claws of the pin engaging that face of the substrate on which the area is disposed, each groove occupying the slide path followed by the corresponding claw of the pin when the pin is being placed on the edge of the substrate, said groove being slightly narrower than its claw in order to ensure that the claw overlaps the tinnable area to some extent.

Advantageously, the terminal pad includes two areas capable of being tinned placed overlying each other on opposite faces of a substrate margin. For a pin having a resilient clamp with three claws disposed side-by-side, with the middle claw engaging one face of the substrate and the outer two claws engaging a second face of the substrate, the tinnable area of the terminal pad placed on the second face of the substrate is preferably T-shaped, with the riser of the T-shape being delimited by the grooves at the locations of the slide paths for the outer two claws, and with the cross-bar of the T-shape terminating the grooves, whereas the tinnable area of the terminal pad on the first face of the substrate is preferably U-shaped, with the groove at the location of the slide path for the middle claw extending between the risers of the U-shape and terminating at the bottom thereof.

The grooves at the locations of the slide paths for the claws of the clamp of a pin form valleys between the blobs of solder covering the tinnable areas of the connection pads, thereby centering the clamp of a pin on the pad without difficulty and also presenting said clamp with a thickness which differs little from that of the substrate and which in any event remains within the elastic limit of the clamp.

The reflow operation with simultaneous or subsequent resoldering by immersing or wetting the pads and the claws of the pins fixed thereto in a bath of solder causes the claws of the pins to press against the edge of the substrate by virtue of the spring effect and consequently to hold the pins on the substrate until the solder solidifies, and also causes the solder on the tinnable areas to migrate onto the claws with the claws and the tinnable areas subsequently being covered by blobs of solder.

BRIEF DESCRIPTION OF THE DRAWINGS

An embodiment of the invention is described by way of example with reference to the accompanying drawings, in which:

FIGS. 1 and 2 are perspective views from above and from below of a pin being presented to a terminal pad in accordance with the invention and ready to receive it;

FIGS. 3 and 4 are perspective views from above and from below of the head of a pin in place on an edge terminal pad in accordance with the invention; and FIGS. 5, 6, and 7 are sections showing how the claws at the head of a pin fasten onto a terminal pad in accordance with the invention before and after reflow soldering, with and without the application of additional solder.

MORE DETAILED DESCRIPTION

Figure 6:
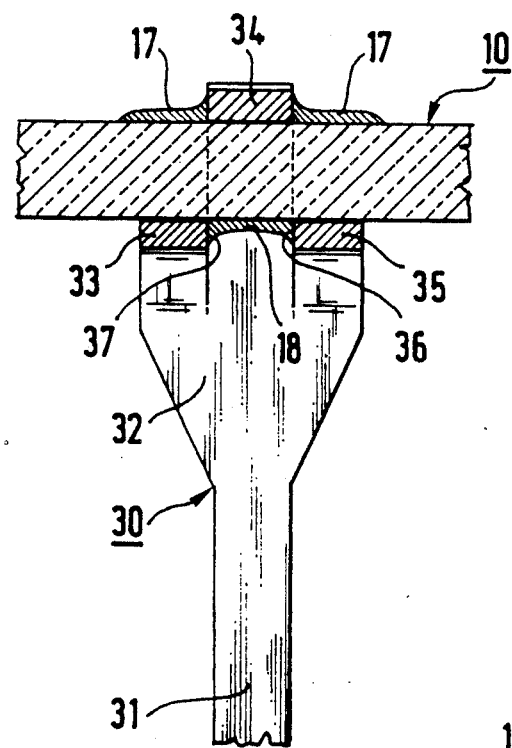

FIGS. 1 and 2 show a corner of a hybrid circuit substrate 10 having two terminal pads on its edge, and also a connection pin 30 facing a terminal pad and ready to be engaged thereon.

The hybrid circuit substrate 10 is constituted by a thin ceramic plate which is about 0.6 mm thick and which bears a network of conducting tracks 11, 12, 13, 14 silk-screened onto each of its faces with each network being covered by a vitrified insulating protective layer 15 or 16 and leading to tinnable areas of component connection pads and of edge terminal pads. Each of the edge terminal pads comprises two tinnable areas 17 and 18 placed overlying each other on opposite faces of the substrate 10 adjacent to its edge. Just like the component connection pads, when the substrate 10 is in the bare state, these tinnable areas 17 and 18 are covered by respective blobs of solder due to a tinning operation for the purpose of subsequently soldering all of the connections by means of a single reflow operation after the components have been put into place on the substrate 10.

The connection pin 30 is made by stamping and folding an electrically conducting metal sheet and it comprises a connection pin per se 31 provided with an enlarged fixing head 32 which is extended by three claws 33, 34, and 35 disposed side-by-side and folded in the same direction by appropriate bending to constitute a resilient clamp with a lateral opening and with flared jaws suitable for the thickness of the substrate 10.

The outer two claws 33 and 35 which are originally folded to have the same profile constitute the bottom jaw of the clamp while the middle claw which is folded only half-way along its length extends above the other two and constitutes the top jaw of the clamp.

The tinned areas 17 and 18 of a terminal pad to be grasped between the claws 33, 34, and 35 of the clamp on a connection pin 30 are notched by grooves 19, 20, and 21 extending perpendicularly to the edge of the substrate and going all the way to said edge. These grooves are slightly narrower than the width of the claws 33, 34, and 35 and they constitute slide paths for the claws when a connection pin 30 is put into place on a terminal pad.

In the example shown with pins being at a small pitch (1/10-th of an inch or 2.54 mm), the tinnable areas 17 and 18 of a terminal pad do not exceed the total width of the three claws 33, 34, and 35 of a connection pin such that the area 17 which is engaged by the single middle claw 34 is notched by a middle groove 19 so as to make it generally U-shaped, while the area 18 for engaging the outer two claws 33 and 35 is notched on each of its sides by respective grooves 20 and 21 so that it is generally T-shaped.

If spacing is less tight, then the tinnable areas of a terminal pad may be greater in width than the three claws 33, 34, and 35 of a connection pin, in which case the area 17 which engages the single middle claw 34 remains generally U-shaped, but with broader risers, while the area 18 which engages the two outer claws 33 and 35 becomes generally W-shaped.

A plurality of adjacent terminal pads may also be interconnected in order to connect a plurality of pins in parallel, e.g. to make it possible for them to pass a current of greater magnitude. In such a case, the facing tinnable areas on opposite faces of the substrate 10 are then in the form of strips running along the edge and they are notched with grooves perpendicular to the edge at a spacing appropriate to receive the claws 33, 34, and 35 of the pins to be connected thereto.

The grooves 19, 20, and 21 at the locations of the slide paths for the claws 33, 34, and 35 of the clamp of a pin 30 form valleys between or on the sides of the blobs of solder that cover the tinnable areas 17 and 18 of a terminal pad, and the claws 33, 34, and 35 are received in said valleys. This provides automatic centering of the clamp of a pin 30 on its terminal pad, and it also reduces the amount by which the jaws of the clamp need to open, thereby ensuring that the clamp does not need to absorb the entire thickness of the blobs of solder covering the tinned areas 17 and 18.

As shown in FIGS. 3, 4, and 5, the claws 33, 34, and 35 of the clamp of a connection pin 30 overlap the edges of the tinnable areas 17 and 18 of the terminal pad once they have been put into place thereon, with the middle claw 34 overlapping at its end and along each of its sides while the outer claws 33 and 35 overlap at their ends and along their facing sides 36 and 37. This is obtained by ensuring that the middle groove 19 constituting the opening in the U-shape of the tinnable area 17 is narrower, e.g. by 0.02 mm to 0.25 mm than the middle claw 34, and by ensuring that the distance between the grooves 20 and 21 cause the riser of the T-shape of tinnable area 18 to be wider, e.g. by 0.1 mm to 0.5 mm than the gap between the two outer claws 33 and 35. In the example shown the width of the opening in the U-shaped of the tinnable area 17 is 0.5 mm while the middle claw is 0.55 mm wide, and the width of the riser of the T-shape of tinnable area 18 is 0.8 mm while the gap between the outer claws 33 and 35 is 0.55 mm.

Figure 7:
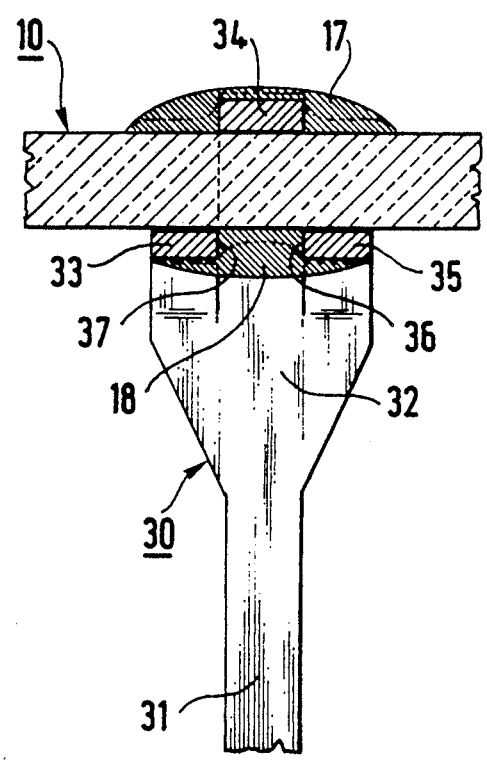

By virtue of the small overlap maintained between the tinnable areas 17 and 18 of the terminal pad and the claws 33, 34, and 35 of a connection pin 30, the solder contained in the blobs can easily migrate onto the claws 33, 34, and 35 during a reflow operation. FIG. 6 shows the result obtained after a reflow operation without adding solder, with the solder that was present in the blobs on the tinnable areas 17 and 18 having covered the edges and the ends of the claws 33, 34, and 35 of the pin 30 due to capillarity. FIG. 7 shows the result obtained after a reflow operation and after simultaneous or subsequent addition of solder by immersing or wetting the edge(s) of the substrate 10 carrying the terminal pads and the pins in a bath of solder, with the solder in the bath and that initially deposited on the tinnable areas 17 and 18 having formed new blobs which completely cover the claws 33, 34, and 35 of the pin 30.

We claim:

1. In combination, hybrid circuit substrate having an edge for fixing a clawed pin including claws constituting jaws of a resilient clamp to opposite first and second faces of the edge of said hybrid circuit substrate, a terminal pad on said hybrid circuit substrate at said edge, said pad having opposite faces one on each side of the substrate including at least one tinnable area on each face for bearing a solder blob on said edge of said substrate in a position suitable for being grasped by the claws of the pin, the improvement wherein said tinnable areas are each notched with at least one groove for receiving a respective claw of the pin engagable with said face of said substrate on which the blob of solder is to be disposed with each groove defining a slide path for a corresponding claw of the pin when the pin is placed on the edge of the substrate, and each groove being slightly narrower than a respective claw to ensure that the claw overlaps the tinnable area to some extent.

2. A combination according to claim 1, for use with a pin having three claws disposed side-by-side, including a middle claw engagable with said first face of the substrate and two laterally outer claws engagable with said second face, wherein said pad has two tinnable areas overlying each other on respective opposite faces of the substrate, with the width of said areas not exceeding the total width of the three claws, wherein the tinnable area on the first face of the substrate is notched by a groove causing it to be generally U-shaped including risers, such that the U-shaped tinnable area runs along either side of the middle claw of the pin upon middle claw contact with said pad, and wherein the tinnable area on the second face of the substrate is notched on either side by grooves causing it to be generally T-shaped including a riser such that said riser lies between the outer claws of the pin upon contact of the outer claws of said pin with said T-shaped tinnable area.

3. A combination according to claim 1, for fixing a pin having three claws disposed side-by-side, with the middle claw engagable with said first face of the substrate and with the two outer claws engagable with said second face, said pad having two tinnable areas overlying each other on opposite faces of the substrate, the width of the two tinnable areas being greater than the combined width of the three claws, wherein the tinnable area on the first face of the substrate is notched by a groove making it generally U-shaped including risers such that said risers run on either side of the middle claw of the pin upon middle claw contact with said pad, and wherein the tinnable area on the second face of the substrate is notched by two grooves causing it to be generally W-shaped including risers, such that the tinnable area risers extend on either side of the outer claws of the pin upon contact of the outer claws of the pin with said pad.

4. A combination according to claim 2, wherein the U-shaped tinnable area has a central opening which is 0.02 mm to 0.25 mm narrower than the middle claw of the pin.

5. A combination according to claim 2, wherein the riser of the T-shaped tinnable area is 0.1 mm to 0.5 mm wider than the gap between the two outer claws of the pin.

6. A combination according to claim 3, wherein the U-shaped tinnable area has a central opening which is 0.02 mm to 0.25 mm narrower than the middle claw of the pin.

7. In a hybrid circuit connection including a hybrid circuit comprising a substrate having an edge and a terminal pad on said substrate at said edge and having opposite first and second faces, one on each side of said substrate, said connection further comprising:
   at least one tinned area solder blob placed on said opposite first and second faces of said substrate terminal pad at said substrate edge, and
   a clawed pin having claws constituting jaws of a resilient clamp fixedly clamped to said solder blobs at opposite first and second faces of said substrate terminal pad, the improvement wherein said solder blobs are each notched with at least one groove defining a slide path for a corresponding claw of the pin, and each groove being slightly narrower than a claw contacting a respective solder blob such that said claws overlap respective solder blobs to some extent, thereby allowing the solder contained in the blobs to easily migrate onto the claws during a solder reflow operation.

8. A hybrid circuit connection as claimed in claim 7, wherein said pin has three claws disposed side-by-side including a middle claw engaging said first face of the substrate and two laterally outer claws engaging said second face, said pad having two solder blobs overlying each other on respective opposite faces of the substrate with the width of said blobs not exceeding the total width of the three claws, wherein the solder blob placed on the first face of the substrate is notched by a groove causing it to be generally U-shaped including risers running along either side of the middle claw of the pin, and wherein the solder blob placed on the second face of the substrate is notched on either side by grooves causing it to be generally T-shaped including a riser lying between the laterally outer claws of the pin.

9. A hybrid circuit connection as claimed in claim 8, wherein the U-shaped solder blob has a central opening which is 0.02 mm to 0.25 mm narrower than the middle claw of the pin.

10. A hybrid circuit connection according to claim 8, wherein the riser of the T-shaped solder blob is 0.1 mm to 0.5 mm wider than the gap between the two outer claws of the pin.

* * * * *